United States Patent
Kojima et al.

(10) Patent No.: US 9,496,345 B2
(45) Date of Patent: Nov. 15, 2016

(54) SEMICONDUCTOR STRUCTURE, SEMICONDUCTOR DEVICE, AND METHOD FOR PRODUCING SEMICONDUCTOR STRUCTURE

(71) Applicants: NATIONAL INSTITUTE OF ADVANCED INDUSTRIAL SCIENCE AND TECHNOLOGY, Tokyo (JP); CENTRAL RESEARCH INSTITUTE OF ELECTRIC POWER INDUSTRY, Tokyo (JP)

(72) Inventors: Kazutoshi Kojima, Ibaraki (JP); Shiyang Ji, Ibaraki (JP); Tetsuya Miyazawa, Kanagawa (JP); Hidekazu Tsuchida, Kanagawa (JP); Koji Nakayama, Hyogo (JP); Tetsuro Hemmi, Hyogo (JP); Katsunori Asano, Hyogo (JP)

(73) Assignees: NATIONAL INSTITUTE OF ADVANCED INDUSTRIAL SCIENCE AND TECHNOLOGY, Tokyo (JP); CENTRAL RESEARCH INSTITUTE OF ELECTRIC POWER INDUSTRY, Tokyo (JP)

( * ) Notice: Subject to any disclaimer, the term of this patent is extended or adjusted under 35 U.S.C. 154(b) by 0 days.

(21) Appl. No.: 14/418,897
(22) PCT Filed: Jul. 31, 2013
(86) PCT No.: PCT/JP2013/070708
§ 371 (c)(1),
(2) Date: Jan. 30, 2015
(87) PCT Pub. No.: WO2014/021365
PCT Pub. Date: Feb. 6, 2014

(65) Prior Publication Data
US 2015/0214306 A1 Jul. 30, 2015

(30) Foreign Application Priority Data
Jul. 31, 2012 (JP) ................................. 2012-170580

(51) Int. Cl.
*H01L 29/15* (2006.01)
*H01L 29/10* (2006.01)
(Continued)

(52) U.S. Cl.
CPC .......... *H01L 29/1608* (2013.01); *C30B 25/20* (2013.01); *C30B 29/36* (2013.01);
(Continued)

(58) Field of Classification Search
CPC ... H01L 29/808; H01L 29/812; H01L 29/24; H01L 29/161; H01L 29/7813; H01L 29/0657; H01L 29/1608; H01L 25/20; H01L 21/02378; H01L 21/0243; H01L 21/02529; H01L 21/02576; H01L 21/02579; H01L 21/02609; H01L 21/0262; H01L 21/046; H01L 29/04; H01L 29/045; H01L 29/167; H01L 29/66068; H01L 29/7393; H01L 29/7395; C30B 25/20
USPC .............. 257/77, E21.09, E29.084, E21.065, 257/E29.104, E21.04, 66, 133; 438/478, 438/507, 104, 135, 1
See application file for complete search history.

(56) References Cited

U.S. PATENT DOCUMENTS

2005/0077591 A1* 4/2005 Fukuda et al. ................. 257/500
2007/0032002 A1* 2/2007 Nonaka et al. ............... 438/192
(Continued)

FOREIGN PATENT DOCUMENTS

| JP | 2008-108824 A | 5/2008 |
| JP | 2011-023502 A | 2/2011 |
| WO | 2010/119792 A1 | 10/2010 |

OTHER PUBLICATIONS

Das et al., "A 13kV 4H-SiC n-channel IGBT with Low Rdiff,on and Fast Switching", Materials Science Forum, 2009, pp. 1183-1186, vols. 600 to 603, Trans Tech Publications, Switzerland.
(Continued)

*Primary Examiner* — Dzung Tran
(74) *Attorney, Agent, or Firm* — Pergament & Cepeda LLP; Milagros A. Cepeda; Edward D. Pergament

(57) ABSTRACT

The present invention provides a semiconductor structure which includes at least a p-type silicon carbide single crystal layer having an α-type crystal structure, containing aluminum at impurity concentration of $1 \times 10^{19}$ cm$^{-3}$ or higher, and having thickness of 50 μm or greater. Further provided is a method for producing the semiconductor structure of the present invention which method includes at least epitaxial growth step of introducing silicon carbide source and aluminum source and epitaxially growing p-type silicon carbide single crystal layer over a base layer made of silicon carbide single crystal having α-type crystal structure, wherein the epitaxial growth step is performed at temperature conditions of from 1,500° C. to 1,700° C., and pressure conditions of from $5 \times 10^3$ Pa to $25 \times 10^3$ Pa.

11 Claims, 9 Drawing Sheets

(51) Int. Cl.
| | |
|---|---|
| H01L 29/66 | (2006.01) |
| H01L 29/16 | (2006.01) |
| C30B 25/20 | (2006.01) |
| C30B 29/36 | (2006.01) |
| H01L 21/02 | (2006.01) |
| H01L 29/04 | (2006.01) |
| H01L 29/167 | (2006.01) |
| H01L 29/739 | (2006.01) |
| H01L 21/04 | (2006.01) |

(52) U.S. Cl.
CPC ..... *H01L21/0262* (2013.01); *H01L 21/02378* (2013.01); *H01L 21/02433* (2013.01); *H01L 21/02529* (2013.01); *H01L 21/02576* (2013.01); *H01L 21/02579* (2013.01); *H01L 21/02609* (2013.01); *H01L 21/046* (2013.01); *H01L 29/04* (2013.01); *H01L 29/045* (2013.01); *H01L 29/167* (2013.01); *H01L 29/66068* (2013.01); *H01L 29/7393* (2013.01); *H01L 29/7395* (2013.01); *H01L 21/0259* (2013.01)

(56) References Cited

U.S. PATENT DOCUMENTS

| | | | |
|---|---|---|---|
| 2007/0200150 A1* | 8/2007 | Asano | 257/273 |
| 2008/0105949 A1* | 5/2008 | Zhang et al. | 257/584 |
| 2010/0084663 A1* | 4/2010 | Ishii et al. | 257/77 |
| 2010/0140628 A1* | 6/2010 | Zhang | 257/77 |
| 2010/0308344 A1 | 12/2010 | Seki et al. | |
| 2011/0233562 A1 | 9/2011 | Harada et al. | |
| 2011/0254010 A1* | 10/2011 | Zhang | 257/66 |

OTHER PUBLICATIONS

Wang and Cooper, "High-Voltage n-Channel IGBTs on Free-Standing 4H-SiC Epilayers", IEEE Transactions on Electron Devices, Feb. 2010, pp. 511 to 515, vol. 57—issue No. 2.

Fanton et al., "Growth of thick p-type SiC epitaxial layers by halide chemical vapor deposition", Journal of Crystal Growth, 2008, pp. 4088 to 4093, vol. 310, Elsevier B.V.

Kojima et al., "Influence of lattice polarity of nitrogen and aluminum doping on 4H-SiC epitaxial layer", Microelectronic Engineering, 2006, pp. 79 to 81, vol. 83, Elsevier B.V.

International Search Report dated Nov. 5, 2013, for corresponding International Patent Application No. PCT/JP2013/070708. (with English translation).

Written Opinion dated Nov. 5, 2013, for corresponding International Patent Application No. PCT/JP2013/070708. (with English translation).

* cited by examiner (0001) Si plane (000-1) C plane

SEMICONDUCTOR STRUCTURE, SEMICONDUCTOR DEVICE, AND METHOD FOR PRODUCING SEMICONDUCTOR STRUCTURE

This application is a National Phase application under 35 U.S.C. 371 of International Application No. PCT/JP2013/070708, filed on Jul. 31, 2013, which claims priority to Japanese provisional application No. 2012-170580, filed on Jul. 31, 2012; all of which are hereby incorporated by reference in their entireties.

TECHNICAL FIELD

The present invention relates to a semiconductor structure that includes a p-type silicon carbide single crystal layer containing aluminum as an impurity substance at a high concentration, a semiconductor device, and a method for producing the semiconductor structure.

BACKGROUND ART

In electric energy utilization, multistage power conversions (AC-DC conversion, voltage and frequency conversion, etc.) are performed in the process from power generation to power consumption, and many semiconductor power devices are used. If these semiconductor power devices have lower loss and higher performance, power consumption will be greatly saved. Particularly, in a future electric energy network (smart grid) in which solar power generation, wind power generation, cogeneration, etc. will be connected, extra-high voltage high-efficiency power converters will be indispensable in order to realize stable power supply. A key to such a converter is a semiconductor power device having an extra-high withstand voltage (higher than 13 kV) and a low loss. Such a semiconductor power device cannot be realized with existing semiconductors such as Si.

On the other hand, SiC has excellent physical properties, including about 10 times as high a breakdown field strength and about 3 times as great a forbidden band width and a thermal conductivity as those of Si, and is an indirect transition semiconductor with which a wide-range conductivity control is easy (regardless of whether it is p-type or n-type). Therefore, SiC can realize a semiconductor power device having an extra-high withstand voltage that cannot be reached with Si.

In order to exert its performance, an extra-high withstand voltage semiconductor power device should include a drift layer having an impurity concentration of from $1\times10^{15}$ cm$^{-3}$ to $1\times10^{13}$ cm$^{-3}$, and a thickness of greater than 100 μm. However, the resistance of this drift layer is unignorable. Particularly, influence of the resistance of the drift layer is outstanding in a unipolar-operation device such as a Schottky diode and a MOSFET. In order to avoid this, a bipolar-operation device such as a PiN diode and an IGBT (Insulated Gate Bipolar Transistor), to which conductivity modulation is applicable, is used.

An n-ch IGBT using an n-type drift layer has a lower MOSFET channel resistance, and a longer minority carrier life time in the n-type drift layer, than those of a p-ch IGBT using a p-type drift layer. Therefore, the On resistance of the n-ch IGBT can be lower than that of the p-ch IGBT.

To produce an n-ch IGBT, it is typically necessary to epitaxially grow an n-type drift layer over a p-type silicon carbide single crystal substrate to a thickness of 100 μm or greater, and form a MOSFET over the surface of the drift layer. In this case, the n-type drift layer must be an extremely high-quality crystal. Particularly, as regards a bipolar-operation silicon carbide device, it has been discovered that a basal plane dislocation, if there is any in the drift layer thereof, expands during electric conduction and induces a stacking fault, and the stacking fault becomes a resistance component during electric conduction to add to the On resistance.

The drift layer is produced by epitaxial growth, whereas basically, any basal plane dislocation present in the drift layer has been propagated from the silicon carbide single crystal substrate forming the base. Hence, the silicon carbide single crystal substrate must have a low dislocation density.

Silicon carbide single crystal substrates are produced by sublimation techniques. It has become able to obtain very high-quality products of n-type silicon carbide single crystal substrates, and crystals having a dislocation density of several hundreds cm$^{-3}$ and a basal plane dislocation density of zero have been produced.

On the other hand, it has been unsuccessful to obtain high-quality products of p-type silicon carbide single crystal substrates, and no silicon carbide single crystal substrates having a high quality comparable to n-types have been produced. In addition, it is difficult to achieve a high impurity concentration in a p-type silicon carbide single crystal substrate; n-type silicon carbide single crystal substrates can be produced to have a resistivity of 20 mΩcm or lower, whereas p-type silicon carbide single crystal substrates result in a resistivity of about several Ωcm, which is higher than the resistivity of the n-types by one digit or two. Hence, the resistance of the single crystal substrate is unignorable in an n-ch IGBT using a p-type silicon carbide single crystal substrate.

To such a problem, there are proposed methods of using a high-quality n-type substrate, and epitaxially growing an n-type drift layer over the n-type substrate to a thickness of about 100 μm to 180 μm, epitaxially growing a p-type layer to a thickness of several μm, then removing the n-type substrate, and forming a MOSFET over the side from which the substrate has been removed, to thereby produce an IGBT structure (see NPLs 1 and 2).

However, according to these methods, a wafer thickness in the actual device production process is the thickness of the drift layer. It is difficult for the drift layer thickness alone to maintain a mechanical strength that is enough to qualify as a wafer, and when a device production process is carried out over a wafer having a large diameter of, for example, 6 inches, there is a problem that the wafer is broken. Particularly, an IGBT of around 10 kV requires a drift layer thickness of around 100 μm, and the mechanical strength cannot endure with only the drift layer thickness.

In order to avoid breaking the wafer, it is necessary to maintain mechanical strength by growing the p-type layer to be grown finally to a large thickness. However, by epitaxial growth, it is difficult to grow a p-type single crystal thin film to a large thickness and to dope it with an impurity at a high concentration. Case examples reported so far are only those having a film thickness of from 80 μm to 100 μm, and an Al impurity concentration of about $5.3\times10^{18}$ cm$^{-3}$ (see NPL 3).

When the Al impurity concentration is only at this level, the resistivity of the P-type layer becomes high to about several hundreds mΩcm, which may be a factor to add to the resistance during electric conduction. This is due to a fact that an Al activation rate in a silicon carbide single crystal is low, which is from several % to 10%. On the other hand, an n-type single crystal thin film has almost always has a 100% activation rate of nitrogen as an n-type impurity, and hence the resistance thereof is low, which is about 20 mΩcm, even when the impurity concentration is only about $5.3\times10^{18}$ cm$^{-3}$.

In order to impart a mechanical strength to a wafer, the method disclosed in NPL 3 employs a growing temperature of 2,000° C. during epitaxial growth, which is a very high growing temperature condition close to the temperature at which a p-type silicon carbide single crystal substrate is produced. At such a high growing temperature, it is possible to grow an epitaxial growth layer at a high growth rate of 200 μm/h, and at the same time, to obtain a mechanical strength owing to thick growing of the film.

However, it has been found out that an influence of the growing temperature on incorporation of Al into SiC is in reverse proportion to the growing temperature (see NPL 4). The higher the growing temperature, the lower the amount of Al to be incorporated into an epitaxially grown layer that is grown as a p-type silicon carbide single crystal layer. Hence, the method of PTL 3 has a problem that it is difficult to achieve a high impurity concentration in the p-type silicon carbide single crystal.

CITATION LIST

Non-Patent Literature

NPL 1: M. K. Das, Q. J. Zhang, R. Callanan, C. Capell, J. Clayton, M. Donofrio, S. Haney, F. Husna, C. Jonas, J. Richmon and J. J. Sumarkeris, Materials Science Forum 600-603, 1183 (2009)
NPL 2: X. Wang and J. A, Cooper, IEEE Transactions on Electron Device 57, 511 (2010)
NPL 3: M. A. Fanton, B. E. Weiland and J. M. Redwing, Journal of Crystal Growth 310, 4088 (2008)
NPL 4: K. Kojima, S. Kuroda, H. Okumura and K. Arai, Microelectronic Engineering 83, 79 (2006)

SUMMARY OF INVENTION

Technical Problem

The present invention aims to solve the conventional problems described above and achieve the object described below. That is, an object of the present invention is to provide a semiconductor structure that has an excellent mechanical strength and can be suppressed to a low resistance during electric conduction, a semiconductor device, and a method for producing the semiconductor structure.

As a result of conducting earnest studies for solving the problems, the present inventors have achieved knowledge that it is possible to produce a p-type epitaxial wafer having an excellent mechanical strength and a low resistance, by growing SiC to a thick epitaxial layer using an epitaxial growth technique, while doping it with Al at a high concentration.

Solution to Problem

The present invention is based on the above knowledge and means for solving the above problems are as follows.

In one aspect, the present invention provides a semiconductor structure, including at least:

a p-type silicon carbide single crystal layer that has an α-type crystal structure, contains aluminum at an impurity concentration of $1\times10^{19}$ cm$^{-3}$ or higher, and has a thickness of 50 μm or greater.

In one variant, the present invention provides a semiconductor structure according to the present invention,
wherein the p-type silicon carbide single crystal layer has a resistivity of 100 mΩcm or lower.

In one variant, the present invention provides a semiconductor structure according to the present invention,
wherein the impurity concentration of aluminum contained in the p-type silicon carbide single crystal layer is $1\times10^{20}$ cm$^{-3}$ or higher.

In one variant, the present invention provides a semiconductor structure according to any one of the present invention, further including:

an n-type silicon carbide single crystal layer that forms a junction with the p-type silicon carbide single crystal layer, has an α-type crystal structure, contains nitrogen at an impurity concentration of $1\times10^{15}$ cm$^{-3}$ or lower, and has a thickness of 50 μm or greater.

In one variant, the present invention provides a semiconductor structure according to the present invention,
wherein the semiconductor structure has a total thickness of 250 μm or greater.

In another aspect, the present invention provides semiconductor structure, including:

a p-type silicon carbide single crystal layer that is formed directly or indirectly over an off substrate inclined from a (0001) plane by 8° or less but greater than 0° and made of a silicon carbide single crystal having an α-type crystal structure, has the α-type crystal structure, and contains aluminum at an impurity concentration of $1\times10^{19}$ cm$^{-3}$ or higher; and an n-type silicon carbide single crystal layer that has the α-type crystal structure, contains nitrogen at an impurity concentration of $1\times10^{15}$ cm$^{-3}$ or lower, has a thickness of 50 μm or greater, and is disposed to form a junction with the p-type silicon carbide single crystal layer.

In one variant, the present invention provides a semiconductor structure according to the present invention,
wherein the p-type silicon carbide single crystal layer has a thickness of 0.5 μm or greater.

In one variant, the present invention provides a semiconductor structure according to the present invention,
wherein the p-type silicon carbide single crystal layer has a resistivity of 100 mΩcm or lower.

In one variant, the present invention provides a semiconductor structure according to the present invention,
wherein the semiconductor structure has a total thickness of 250 μm or greater.

In one variant, the present invention provides a semiconductor structure according to the present invention, further including:

a first n-type silicon carbide single crystal layer that has an α-type crystal structure, contains nitrogen at an impurity concentration of from $1\times10^{17}$ cm$^{-3}$ to $1\times10^{19}$ cm$^{-3}$, and has a thickness of 10 μm or less; and a first p-type silicon carbide single crystal layer that has the α-type crystal structure, contains aluminum at an impurity concentration of from $1\times10^{17}$ cm$^{-3}$ to $1\times10^{18}$ cm$^{-3}$, and has a thickness of from 0.5 μm to 5 μm, wherein the first n-type silicon carbide single crystal layer, the n-type silicon carbide single crystal layer as a second n-type silicon carbide single crystal layer, the first p-type silicon carbide single crystal layer, and the p-type silicon carbide single crystal layer as a second p-type silicon carbide single crystal layer are formed in this order over the off substrate inclined from the (0001) plane by 8° or less but greater than 0° and made of the silicon carbide single crystal having the α-type crystal structure.

In one variant, the present invention provides a semiconductor structure according to the present invention, further including:

a third n-type silicon carbide single crystal layer that has an α-type crystal structure, contains nitrogen at an impurity concentration of from $1\times10^{15}$ cm$^{-3}$ to $1\times10^{17}$ cm$^{-3}$, and has a thickness of 1 μm or less, wherein the third n-type silicon carbide single crystal layer is disposed between the second n-type silicon carbide single crystal layer and the first p-type silicon carbide single crystal layer.

In one variant, the present invention provides a semiconductor structure according to the present invention, wherein the semiconductor structure has a TTV value equal to or less than a TTV value of the off substrate, where the TTV values represent thickness variation.

In one variant, the present invention provides a semiconductor device, including:

the semiconductor structure according to the present invention; and a MOS structure formed over a [000-1]C plane of the semiconductor structure, wherein the semiconductor device is an IGBT semiconductor device.

In one aspect, the present invention provides a method for producing the semiconductor structure according to the present invention, including at least:

introducing a silicon carbide source and an aluminum source and epitaxially growing a p-type silicon carbide single crystal layer over a base layer made of a silicon carbide single crystal having an α-type crystal structure, wherein the epitaxial growth is performed at temperature conditions of from 1,500° C. to 1,700° C., and at pressure conditions of from $5\times10^3$ Pa to $25\times10^3$ Pa.

In one variant, the present invention provides a method for producing the semiconductor structure according to the present invention, wherein an epitaxial growth rate of the p-type silicon carbide single crystal layer during the epitaxial growth is from 15 μm/h to 100 μm/h.

In one variant, the present invention provides a method for producing the semiconductor structure according to the present invention, wherein a silane gas and a propane gas are used as the silicon carbide source, and wherein a hydrogen gas is used as a carrier gas of the silicon carbide source.

In one variant, the present invention provides a method for producing the semiconductor structure according to the present invention, wherein the p-type silicon carbide single crystal layer is formed directly or indirectly over an off substrate inclined from a (0001) plane by 8° or less but greater than 0° and made of a silicon carbide single crystal having an α-type crystal structure.

In one variant, the present invention provides a method for producing the semiconductor structure according to the present invention, further including:

forming an n-type silicon carbide single crystal layer having an α-type crystal structure, containing nitrogen at an impurity concentration of $1\times10^{15}$ cm$^{-3}$ or lower, and having a thickness of 50 μm or greater, over an off substrate inclined from a (0001) plane by 8° or less but greater than 0° and made of a silicon carbide single crystal having the α-type crystal structure, wherein the epitaxial growth epitaxially grows the p-type silicon carbide single crystal layer over the base layer, which is the n-type silicon carbide single crystal layer.

In one variant, the present invention provides a method for producing the semiconductor structure according to the present invention, further including:

forming a first n-type silicon carbide single crystal layer having an α-type crystal structure, containing nitrogen at an impurity concentration of from $1\times10^{17}$ cm$^{-3}$ to $1\times10^{19}$ cm$^{-3}$, and having a thickness of 10 μm or less, over an off substrate inclined from a (0001) plane by 8° or less but greater than 0° and made of a silicon carbide single crystal having the α-type crystal structure;

forming a second n-type silicon carbide single crystal layer having the α-type crystal structure, containing the nitrogen at an impurity concentration of $1\times10^{15}$ cm$^{-3}$ or lower, and having a thickness of 50 μm or greater, over the first n-type silicon carbide single crystal layer; and forming a first p-type silicon carbide single crystal layer having the α-type crystal structure, containing aluminum at an impurity concentration of from $1\times10^{17}$ cm$^{-3}$ to $1\times10^{18}$ cm$^{-3}$, and having a thickness of from 0.5 μm to 5 μm, over the second n-type silicon carbide single crystal layer, wherein the epitaxial growth epitaxially grows the p-type silicon carbide single crystal layer over the base layer, which is the first p-type silicon carbide single crystal layer.

In one variant, the present invention provides a method for producing the semiconductor structure according to the present invention, further including:

forming a third n-type silicon carbide single crystal layer having an α-type crystal structure, containing nitrogen at an impurity concentration of from $1\times10^{15}$ cm$^{-3}$ to $1\times10^{17}$ cm$^{-3}$, and having a thickness of 1 μm or less, over the second n-type silicon carbide single crystal layer, wherein the formation of the first p-type silicon carbide single crystal layer forms the first p-type silicon carbide single crystal layer over the third n-type silicon carbide single crystal layer.

In one variant, the present invention provides a method for producing the semiconductor structure according to the present invention, further including:

separating the second n-type silicon carbide single crystal layer and the first n-type silicon carbide single crystal layer from each other after the epitaxial growth, to thereby remove the off substrate and the first n-type silicon carbide single crystal layer.

Advantageous Effects of Invention

According to the present invention, it is possible to solve the various problems of the conventional techniques described above, and provide a semiconductor structure that has an excellent mechanical strength and can be suppressed to a low resistance during electric conduction, a semiconductor device, and a method for producing the semiconductor structure.

Figure 1:
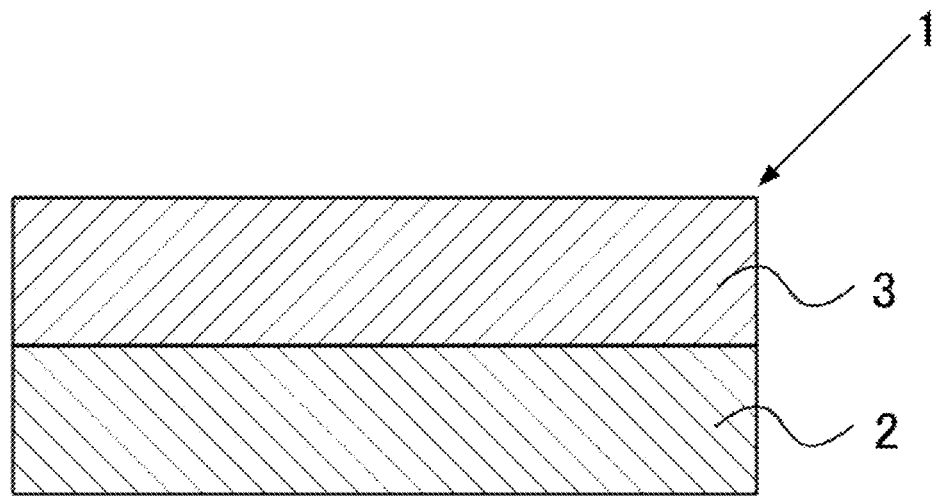
FIG. 1 is an explanatory diagram showing a cross-sectional structure of a semiconductor structure according to a first embodiment.

DESCRIPTION OF EMBODIMENTS (Semiconductor Structure and Semiconductor Device)

Embodiments of a semiconductor structure and a semiconductor device of the present invention will be explained below.

First Embodiment

A semiconductor structure of the present invention includes at least a p-type silicon carbide single crystal layer having an α-type crystal structure, containing aluminum at an impurity concentration of $1 \times 10^{19}$ cm$^{-3}$ or higher, and having a thickness of 50 μm or greater.

When the impurity concentration is $1 \times 10^{19}$ cm$^{-3}$ or higher, an aluminum activation rate is high, and resistance during electric conduction can be suppressed. The reason is as follows. Because aluminum is added at a high concentration, the average distance between the added aluminum atoms is short, and a Coulomb potential is screened as a result. Hence, aluminum no longer captures holes from the valence band, and the activation rate thereof is high as a result. This effect is obtained in proportion to the impurity concentration. Hence, the impurity concentration is more preferably $6 \times 10^{19}$ cm$^{-3}$ or higher, and particularly preferably $1 \times 10^{20}$ cm$^{-3}$ at which the aluminum activation rate will be 100%.

Although a higher impurity concentration is more preferable, the upper limit thereof is about $1 \times 10^{21}$ cm$^{-3}$.

When the p-type silicon carbide single crystal layer has a thickness of 50 μm or greater, it can have a sufficient mechanical strength as a mechanical strength necessary in a semiconductor device production process. Further, from such a standpoint, the thickness is more preferably 100 μm or greater.

The upper limit of the thickness of the p-type silicon carbide single crystal layer is about 300 μm, in terms of avoiding a production efficiency drop due to the layer having a more than necessary mechanical strength.

It is preferable that the resistivity of the p-type silicon carbide single crystal layer be as low as possible. For example, the resistivity thereof is preferably 10 mΩm or lower, and more preferably 20 mΩm or lower. In this case, the aluminum activation rate is preferably 5% or higher, and more preferably 100%. The lower limit of the resistivity is preferably about 5 mΩm.

The crystal structure of silicon carbide (SiC) in the p-type silicon carbide single crystal layer is an α-type. Such a crystal structure can be homoepitaxially grown over an α-type silicon carbide single crystal substrate having a large diameter and a high quality, which is advantageous in improvement of the quality of the p-type silicon carbide single crystal, and application thereof to a device.

As a member of a semiconductor device, the semiconductor structure may be composed only of the p-type silicon carbide single crystal layer, or may include any other structure. The any other structure is not particularly limited, and examples thereof include a substrate, and an n-type semiconductor layer.

The total thickness of the semiconductor structure is not particularly limited, but is preferably 250 μm or greater, in terms of imparting a mechanical strength necessary in a formation process of a device to be formed using the semiconductor structure. The upper limit of the total thickness is about 350 μm.

As an example of the semiconductor structure, FIG. 1 shows a cross-sectional structure of a semiconductor structure according to a first embodiment.

The semiconductor structure 1 according to the first embodiment includes an n-type silicon carbide single crystal layer 2, and a p-type silicon carbide single crystal layer 3 forming a junction with the n-type silicon carbide single crystal layer 2. The junction plane is a p/n junction.

The p-type silicon carbide single crystal layer 3 has an α-type crystal structure, contains aluminum at an impurity concentration of $1 \times 10^{19}$ cm$^{-3}$ or higher, and has a thickness of 50 μm or greater.

With the p-type silicon carbide single crystal layer 3 having such a configuration, it is possible to realize a semiconductor structure that has an excellent mechanical strength and can be suppressed to a low resistance during electric conduction, as explained above as regards the p-type silicon carbide single crystal layer.

The crystal structure of silicon carbide in the n-type silicon carbide single crystal layer 2 is not particularly limited, but when it is an α-type, the n-type silicon carbide single crystal layer can be homoepitaxially grown over an α-type silicon carbide single crystal substrate having a large diameter and a high quality, which is advantageous in improvement of the quality of the n-type silicon carbide single crystal layer, and application thereof to a device.

The nitrogen concentration in the n-type silicon carbide single crystal layer 2 is not particularly limited, but is preferably $1 \times 10^{15}$ cm$^{-3}$ or lower. When the concentration is higher than $1 \times 10^{15}$ cm$^{-3}$, the semiconductor structure is no longer suitable for an extra-high withstand voltage device having a withstand voltage of higher than 10 kV. The lower limit of the concentration is preferably about $5 \times 10^{13}$ cm$^{-3}$.

The thickness of the n-type silicon carbide single crystal layer 2 is not particularly limited, but a thickness of 50 μm or greater is preferable in terms of maintaining a mechanical strength. The upper limit of the thickness is preferably about 300 μm.

Second Embodiment

Another semiconductor structure of the present invention includes at least: as the p-type silicon carbide single crystal layer of the first embodiment, a p-type silicon carbide single crystal layer that is formed directly or indirectly over an off substrate inclined from a (0001) plane by 8° or less but greater than 0° and made of a silicon carbide single crystal having an α-type crystal structure, has the α-type crystal structure, and contains aluminum at an impurity concentration of $1\times10^{19}$ cm$^{-3}$ or higher; and an n-type silicon carbide single crystal layer that has the α-type crystal structure, contains nitrogen at an impurity concentration of $1\times10^{15}$ cm$^{-3}$ or lower, has a thickness of 50 μm or greater, and is disposed to form a junction with the p-type silicon carbide single crystal layer.

When the impurity concentration in the p-type silicon carbide single crystal layer is $1\times10^{19}$ cm$^{-3}$ or higher, an aluminum activation rate is high, and resistance during electric conduction can be suppressed. From such a standpoint, the impurity concentration is more preferably $6\times10^{19}$ cm$^{-3}$ or higher, and particularly preferably $1\times10^{20}$ cm$^{-3}$ or higher, at which the aluminum activation rate will be 100%.

Although a higher impurity concentration is more preferable, the upper limit thereof is about $1\times10^{21}$ cm$^{-3}$.

The thickness of the p-type silicon carbide single crystal layer is not particularly limited, but a thickness of 0.5 μm or greater is a sufficient thickness for forming a p/n junction structure. Further, in terms of maintaining a mechanical strength, the thickness is more preferably 50 μm or greater, and particularly preferably 100 μm or greater.

The upper limit of the thickness of the p-type silicon carbide single crystal layer is preferably about 300 μm, in terms of suppressing an on resistance, and in terms of compatibility to a device production process.

It is preferable that the resistivity of the p-type silicon carbide single crystal layer be as low as possible. For example, the resistivity thereof is preferably 100 mΩcm or lower, and more preferably 20 mΩcm or lower. The lower limit of the resistivity is preferably about 5 mΩcm.

The crystal structure of silicon carbide (SiC) in the p-type silicon carbide single crystal layer is an α-type. Such a crystal structure can form a 4H-type crystal structure, and can be homoepitaxially grown over a 4H-type silicon carbide single crystal substrate having a large diameter and a high quality, which is advantageous in improvement of the qualities of the epitaxially grown layer such as an excellent surface flatness, a low fault density, and a high electron mobility, and application thereof to a device.

When the crystal structure of silicon carbide in the n-type silicon carbide single crystal layer is an α-type, the n-type silicon carbide single crystal layer can be homoepitaxially grown over an α-type silicon carbide single crystal substrate having a large diameter and a high quality, which is advantageous in improvement of the quality of the n-type silicon carbide single crystal layer, and application thereof to a device.

When the nitrogen concentration in the n-type silicon carbide single crystal layer is higher than $1\times10^{15}$ cm$^{-3}$, the semiconductor structure is no longer suitable for an extra-high withstand voltage device having a withstand voltage of higher than 10 kV. The lower limit of the concentration is preferably about $5\times10^{13}$ cm$^{-3}$.

It is preferable that the thickness of the n-type silicon carbide single crystal layer 2 be 50 μm or greater, in terms of maintaining a mechanical strength. The upper limit of the thickness is preferably about 300 μm.

When an inclination angle (off angle) of the off substrate from a (0001) plane is 8° or less but greater than 0°, a silicon carbide single crystal layer having an excellent surface flatness can be formed thereon by step flow growing. Further, when the off substrate is made of a silicon carbide single crystal having an α-type crystal structure, homoepitaxial growth can be performed over an α-type silicon carbide single crystal substrate having a large diameter and a high quality, which is advantageous in improvement of the quality of an epitaxially grown layer, and application thereof to a device. The inclination angle represents a value based on a standard, and tolerates a margin of error of (±0.25°). For example, a margin of error of ±0.25° from an inclination angle of 8° is tolerated for an off substrate having a standard value of 8°.

When the p-type silicon carbide single crystal layer is formed directly or indirectly over the off substrate, it undergoes step flow growth, resulting in production of a silicon carbide single crystal layer having an excellent surface flatness.

As a member of a semiconductor device, the semiconductor structure may be composed only of the off substrate and the p-type silicon carbide single crystal layer, or may include any other structure. The any other structure is not particularly limited, and examples thereof include an n-type semiconductor layer. A final product of the semiconductor structure may be one from which the off substrate is removed.

The total thickness of the semiconductor structure is not particularly limited, but is preferably 250 μm or greater, in terms of imparting a mechanical strength necessary in a formation process of a device to be formed using the semiconductor structure. The upper limit of the total thickness is about 350 μm.

Figure 2:
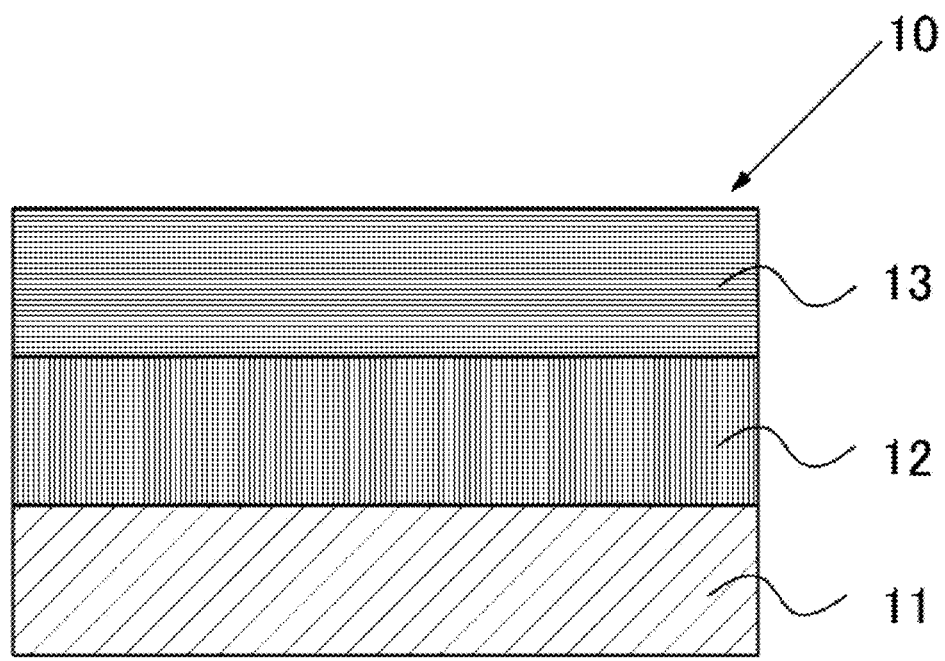
FIG. 2 is an explanatory diagram showing a cross-sectional structure of a semiconductor structure according to a second embodiment.

As an example of the semiconductor structure, FIG. 2 shows a cross-sectional structure of a semiconductor structure according to a second embodiment.

The semiconductor structure 10 according to the second embodiment includes over an off substrate 11, an n-type silicon carbide single crystal layer 12, and a p-type silicon carbide single crystal layer 13 forming a junction with the n-type silicon carbide single crystal layer 12. The junction plane is a p/n junction.

The off substrate 11 is an off substrate inclined from a (0001) plane by 8° or less but greater than 0° and made of a silicon carbide single crystal having an α-type crystal structure.

When the off substrate 11 has such a configuration, a silicon carbide single crystal layer having an excellent surface flatness can be produced thereon by step flow growing, as explained above as regards the off substrate.

The p-type silicon carbide single crystal layer 13 is layer having an α-type crystal structure, and containing aluminum at an impurity concentration of $1\times10^{19}$ cm$^{-3}$ or higher.

When the p-type silicon carbide single crystal layer 13 has such a configuration, it is possible to realize a semiconductor structure that can be suppressed to a low resistance during electric conduction, as explained above as regards the p-type silicon carbide single crystal layer.

The n-type silicon carbide single crystal layer 12 has the α-type silicon structure, contains nitrogen at an impurity concentration of $1\times10^{15}$ cm$^{-3}$ or lower, has a thickness of 50 μm or greater, and is disposed to form a junction with the p-type silicon carbide single crystal layer.

When the n-type silicon carbide single crystal layer 12 has such a configuration, it is possible to realize a semiconductor structure having an excellent mechanical strength and suitable for an extra-high withstand voltage device having a p/n junction, as explained above as regards the n-type silicon carbide single crystal layer.

Third Embodiment

Figure 3:
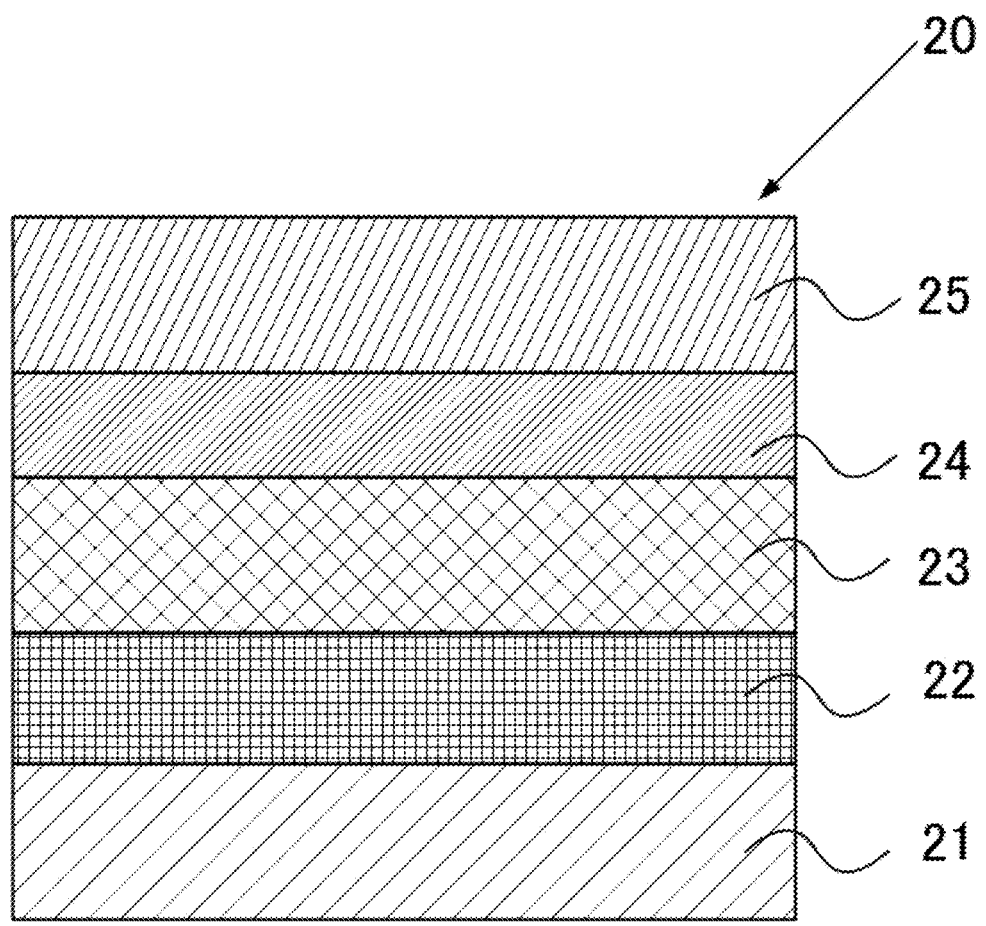
FIG. 3 is an explanatory diagram showing a cross-sectional structure of a semiconductor structure according to a third embodiment.

Next, as another example of the semiconductor structure, FIG. 3 shows a cross-sectional structure of a semiconductor structure according to a third embodiment.

The semiconductor structure 20 according to the third embodiment includes over an off substrate 21, a first n-type silicon carbide single crystal layer 22, a second n-type silicon carbide single crystal layer 23, a first p-type silicon carbide single crystal layer 24, and a second p-type silicon carbide single crystal layer 25, which are stacked in this order.

The semiconductor structure 20 according to the third embodiment is a modified example of the semiconductor structure 10 according to the second embodiment, and the off substrate 21, the second n-type silicon carbide single crystal layer 23, and the second p-type silicon carbide single crystal layer 25 have the same configuration as that of the off substrate 11, the n-type silicon carbide single crystal layer 12, and the p-type silicon carbide single crystal layer 13 of the semiconductor structure 10 according to the second embodiment, respectively. Hence, explanation about these will be skipped, and the first n-type silicon carbide single crystal layer 22 and the first p-type silicon carbide single crystal layer 24 will be explained.

The first n-type silicon carbide single crystal layer 22 is provided in order to relax a stress due to an impurity concentration difference between the substrate and the second n-type silicon carbide single crystal layer.

The first n-type silicon carbide single crystal layer 22 is preferably a layer that has an α-type crystal structure, contains nitrogen at an impurity concentration of from $1 \times 10^{17}$ cm$^{-3}$ to $1 \times 10^{19}$ cm$^{-3}$, and has a thickness of 10 μm or less. That is, when it has the α-type crystal structure, it can form a 4H-type crystal structure, can be homoepitaxially grown over a 4H-type silicon carbide single crystal substrate having a large diameter and a high quality, and can be formed as an n-type silicon carbide single crystal layer having high qualities such as an excellent surface flatness and a low fault density. The impurity concentration of from $1 \times 10^{17}$ cm$^{-3}$ to $1 \times 10^{19}$ cm$^{-3}$ is suitable for relaxation of a stress due to an impurity concentration difference between the substrate and the first n-type silicon carbide single crystal layer. The thickness of 10 μm or less is suitable for relaxation of the stress due to the impurity concentration difference between the substrate and the second n-type silicon carbide single crystal layer. The lower limit of the thickness is preferably about 5 μm.

The first p-type silicon carbide single crystal layer 24 is provided in order to effect a conductivity modulation by carrier injection during electric conduction.

The first p-type silicon carbide single crystal layer is preferably a layer that has an α-type crystal structure, contains aluminum at an impurity concentration of from $1 \times 10^{17}$ cm$^{-3}$ to $1 \times 10^{18}$ cm$^{-3}$, and has a thickness of from 0.5 μm to 5 μm. That is, when it has the α-type crystal structure, it can form a 4H-type crystal structure, can be homoepitaxially grown over a 4H-type silicon carbide single crystal substrate having a large diameter and a high quality, and enables improvement of the qualities of an n-type silicon carbide single crystal layer, such as an excellent surface flatness and a low fault density. The impurity concentration of from $1 \times 10^{17}$ cm$^{-3}$ to $1 \times 10^{18}$ cm$^{-3}$ is favorable for carrier injection. The thickness of from 0.5 μm to 5 μm is favorable for resistance control during electric conduction.

Further, it is preferable that the semiconductor structure 20 according to the third embodiment have a TTV (Total Thickness Variation) value that is smaller than a TTV value of the off substrate 21, where the TTV values represent thickness variation. Such a configuration is favorable for a semiconductor device production process. It is possible to measure a TTV with an instrument configured to test an in-plane variation of the thickness of a wafer non-destructively and contactlessly by utilizing optical interference.

When the off substrate 21 and the first n-type silicon carbide single crystal layer 22 are removed from the semiconductor structure 20 according to the third embodiment after it is completed, the remaining structure can be used as a semiconductor wafer for an IGBT semiconductor device production.

Fourth Embodiment

Figure 4:
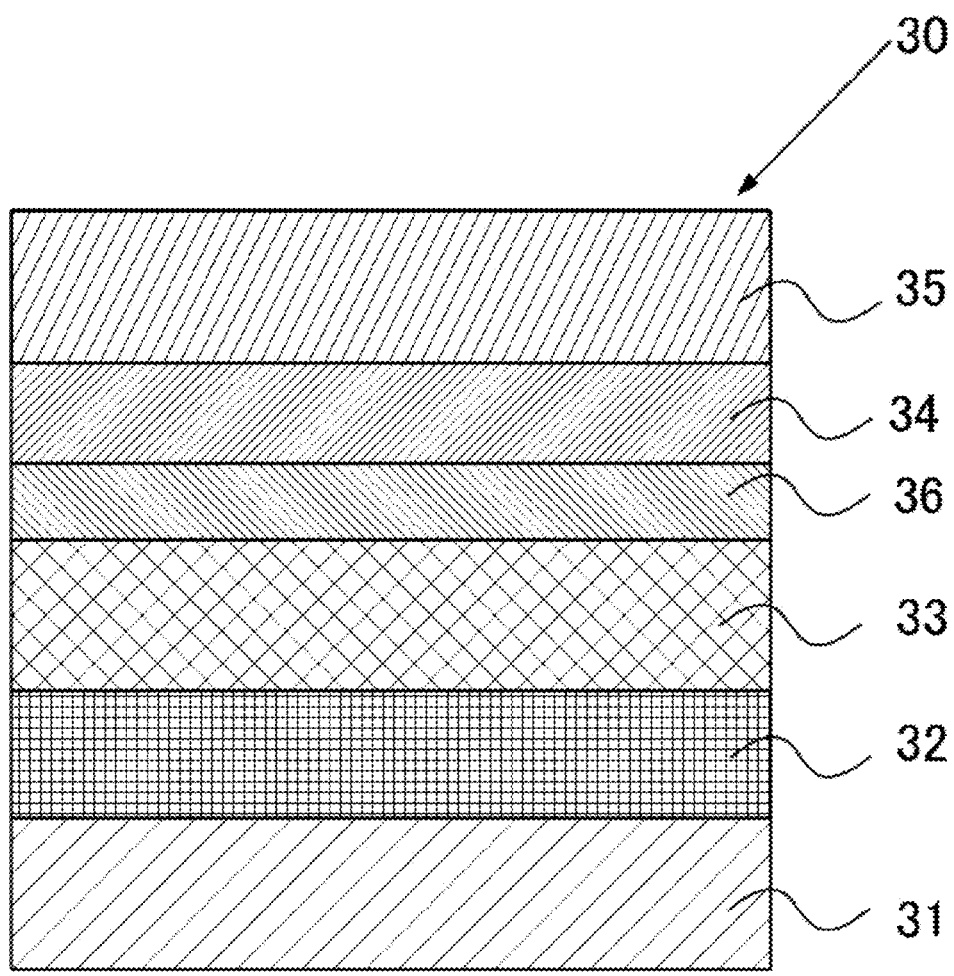
FIG. 4 is an explanatory diagram showing a cross-sectional structure of a semiconductor structure according to a fourth embodiment.

Next, as another example of the semiconductor structure, FIG. 4 shows a cross-sectional structure of a semiconductor structure according to a fourth embodiment.

The semiconductor structure 30 according to the fourth embodiment includes over an off substrate 31, a first n-type silicon carbide single crystal layer 32, a second n-type silicon carbide single crystal layer 33, a third n-type silicon carbide single crystal layer 36, a first p-type silicon carbide single crystal layer 34, and a second p-type silicon carbide single crystal layer 35, which are stacked in this order.

The semiconductor structure 30 according to the fourth embodiment is a modified example of the semiconductor structure 20 according to the third embodiment, and the off substrate 31, the first n-type silicon carbide single crystal layer 32, the second n-type silicon carbide single crystal layer 33, the first p-type silicon carbide single crystal layer 34, and the second p-type silicon carbide single crystal layer 35 except for the third n-type silicon carbide single crystal layer 36 have the same configuration as that of the off substrate 21, the first n-type silicon carbide single crystal layer 22, the second n-type silicon carbide single crystal layer 23, the first p-type silicon carbide single crystal layer 24, and the second p-type silicon carbide single crystal layer 25 of the semiconductor structure 20 according to the third embodiment, respectively. Hence, explanation about these will be skipped, and the third n-type silicon carbide single crystal layer will be explained.

The third n-type silicon carbide single crystal layer 36 is provided in order to improve the properties at the p/n junction interface.

The third n-type silicon carbide single crystal layer 36 is preferably a layer that has an α-type crystal structure, contains nitrogen at an impurity concentration of from $1 \times 10^{15}$ cm$^{-3}$ to $1 \times 10^{17}$ cm$^{-3}$, and has a thickness of 1 μm or less. That is, when it has the α-type crystal structure, it can form a 4H-type crystal structure, can be homoepitaxially grown over a 4H-type silicon carbide single crystal substrate having a large diameter and a high quality, and can be formed as an n-type silicon carbide single crystal layer having high qualities such as an excellent surface flatness and a low fault density. The impurity concentration of from $1 \times 10^{15}$ cm$^{-3}$ to $1 \times 10^{17}$ cm$^{-3}$ is preferable in terms of a withstand voltage property. The thickness of 1 μm or less is preferable in terms of a withstand voltage property as above. The lower limit of the thickness is about 0.1 μm.

Further, it is preferable that the semiconductor structure 30 according to the fourth embodiment have a TTV value that is smaller than a TTV value of the off substrate 31, like the semiconductor structure 20 according to the third embodiment, where the TTV values represent thickness variation.

Like the semiconductor structure 20 according to the third embodiment, when the off substrate 31 and the first n-type silicon carbide single crystal layer 32 are removed from the semiconductor structure 30 according to the fourth embodiment after it is completed, the remaining structure can be used as a semiconductor wafer for an IGBT semiconductor device formation.

Fifth Embodiment

Figure 5:
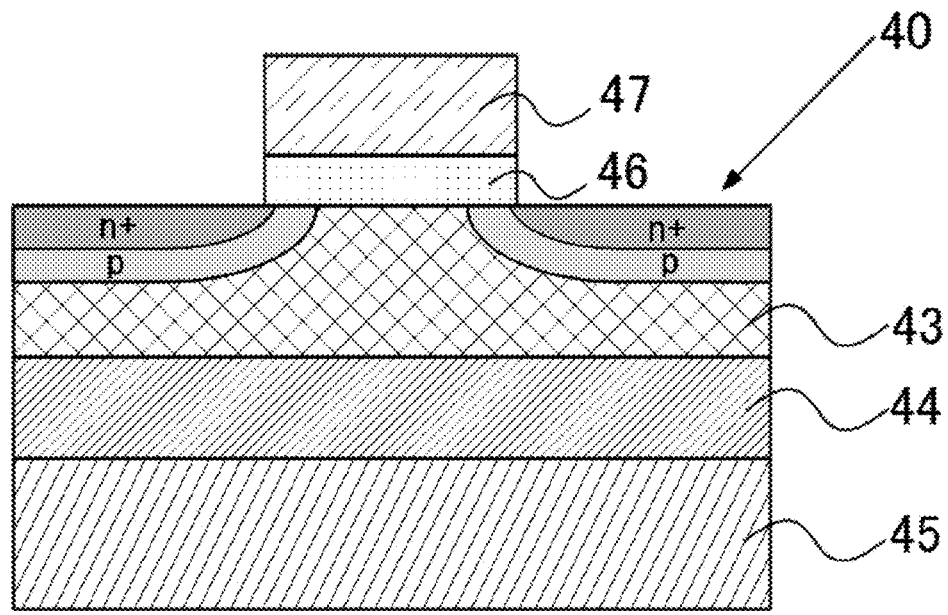
FIG. 5 is an explanatory diagram showing a cross-sectional structure of a semiconductor device according to a fifth embodiment.

Next, as an example of a semiconductor device, FIG. 5 shows a cross-sectional structure of a semiconductor device according to a fifth embodiment. The semiconductor device according to the fifth embodiment is a configuration example of an IGBT semiconductor device as an example of a semiconductor device. The semiconductor structure of the present invention can also be applied to semiconductor devices other than this.

The semiconductor device 40 (IGBT semiconductor device) according to the fifth embodiment is a device obtained by removing the off substrate 21 and the first n-type silicon carbide single crystal layer 22 from the semiconductor structure 20 according to the third embodiment, and forming, as a MOS structure, a gate electrode 47 over the second n-type silicon carbide single crystal layer 23 via an insulation film 46. That is, the reference sign 45 denotes a second p-type silicon carbide single crystal layer, the reference sign 44 denotes a first p-type silicon carbide single crystal layer, and the reference sign 43 denotes a second n-type silicon carbide single crystal layer, and these layers have the same configuration as that of the second p-type silicon carbide single crystal layer 25, the first p-type silicon carbide single crystal layer 24, and the second n-type silicon carbide single crystal layer 23 of the semiconductor structure 20 according to the third embodiment, respectively.

The insulation film 46 and the gate electrode 47 are not particularly limited, and may be formed by a publicly-known method. The MOS structure shown in FIG. 5 is a simplified configuration example for explanation purposes. Instead of this, an arbitrary conventionally publicly-known MOS structure selected according to the purpose may be formed.

The semiconductor device 40 having such a configuration can realize a semiconductor power device that can perform an operation as an IGBT semiconductor, and has an excellent mechanical strength, uses a low-resistance semiconductor structure as a wafer, and has an extra-high withstand voltage and a low loss.

(Method for Producing Semiconductor Structure)

A method for producing a semiconductor structure according to the present invention includes at least an epitaxial growth step of introducing a silicon carbide source and an aluminum source and epitaxially growing a p-type silicon carbide single crystal layer over a base layer made of a silicon carbide single crystal having an α-type crystal structure. Above all, the core technique is performing the epitaxial growth step at temperature conditions of from 1,500° C. to 1,700° C., and at pressure conditions of from $5 \times 10^3$ Pa to $25 \times 10^3$ Pa.

Such epitaxial growth conditions can realize production of the semiconductor structure of the present invention that has an excellent mechanical strength, and can be suppressed to a low resistance during electric conduction.

That is, the only method conventionally available for forming a p-type silicon carbide single crystal layer containing aluminum at a high concentration is an ion injection technique. However, since a p-type silicon carbide single crystal having a thickness of only about several µm exists over a thick n-type epitaxial film having a thickness of 180 µm as shown in NPLs 1 and 2, etc., the mechanical strength will be insufficient when the substrate is removed, and the wafer is likely to be broken during a device process. However, according the above method for producing a semiconductor structure, it is possible to epitaxially grow the p-type silicon carbide single crystal layer that has a large film thickness and a low resistance, which makes it possible to secure a mechanical strength enough to endure a device process even after the substrate is removed.

The temperature conditions are not particularly limited as long as they are within the value range described above, but are more preferably from 1,580° C. to 1,650° C. When the temperature conditions are lower than 1,580° C., the growth rate may drop due to crystallinity degradation attributable to a triangular defect, and occurrence of Si liquid droplets, which may make it impossible to grow the thick p-type silicon carbide single crystal layer within an appropriate time. When the temperature conditions are higher than 1,650° C., a carrier gas (hydrogen gas) may have a stronger hydrogen etching effect, and reduce the growth rate and the amount of Al to be incorporated into the crystal, which may make it impossible to grow the p-type silicon carbide single crystal layer having a low resistance within an appropriate time.

The pressure conditions are not particularly limited as long as they are within the value range described above, but are more preferably from $10 \times 10^3$ Pa to $14 \times 10^3$ Pa. For example, when the pressure conditions are higher than $14 \times 10^3$ Pa, the p-type silicon carbide single crystal layer may have a broad film thickness distribution, which may make it impossible to secure parallelness when the substrate is peeled.

The epitaxial growth rate of the p-type silicon carbide single crystal layer in the epitaxial growth step is not particularly limited, but preferably from 15 µm/h to 100 µm/h, and more preferably for 15 µm/h to 50 µm/h, because these rates are suitable for efficient growth and high concentration doping of Al.

The silicon carbide source is not particularly limited, and a publicly-known silicon carbide source may be used. Examples include a silane gas, and a propane gas. The carrier gas for the silicon carbide source may be a hydrogen gas, etc. The aluminum source may be trimethyl aluminum, etc.

Here, it is preferable that the composition ratio (molar ratio) C/Si between C and Si contained in the silicon carbide source satisfy the following formula: $0.6 \leq C/Si \leq 1.1$. When the composition ratio is less than 0.6, the p-type silicon carbide single crystal layer to be obtained may not be able to have a low resistance. When it is greater than 1.1, the p-type silicon carbide single crystal layer may not be obtained, or the p-type silicon carbide single crystal layer to be obtained may have a significantly poor mechanical strength.

When a hydrogen gas is used as the carrier gas, and a silane gas is used as the silicon carbide source, it is preferable that the composition ratio (molar ratio) H/Si between H in the carrier gas and Si in the silane gas satisfy the following formula: $450 \leq H/Si \leq 1,700$. When the composition ratio is less than 450, undulations may occur in the growth surface of the p-type silicon carbide single crystal layer. When it is greater than 1,700, it may not be able to maintain reduced pressure conditions for forming the p-type silicon carbide single crystal layer.

The p-type silicon carbide single crystal layer is not particularly limited, but it is preferable that it be formed directly or indirectly over an off substrate inclined from a (0001) plane by 8° or less but greater than 0° and made of a silicon carbide single crystal having an α-type crystal structure, because the silicon carbide single crystal layer can be produced to have an excellent surface flatness by undergoing step flow growth.

Further, it is preferable that the method for producing the semiconductor structure include an n-type silicon carbide single crystal layer forming step of forming an n-type silicon carbide single crystal layer having the α-type crystal structure, containing nitrogen at an impurity concentration of $1 \times 10^{15}$ cm$^{-3}$ or lower, and having a thickness of 50 μm or greater, over the off substrate. In this case, the epitaxial growth step is a step of epitaxially growing a p-type silicon carbide single crystal layer over the n-type silicon carbide single crystal layer, which serves as a base layer.

By forming such an n-type silicon carbide single crystal layer, it is possible to produce the semiconductor structure according to the second embodiment that includes a p/n junction (see FIG. 2).

The method for forming the n-type silicon carbide single crystal layer in the n-type silicon carbide single crystal layer forming step is not particularly limited, and examples include a method of epitaxially growing the n-type silicon carbide single crystal layer by a publicly-known chemical vapor deposition method. The silicon carbide source during the formation may be, for example, a silane gas, and a propane gas. The carrier gas for the silicon carbide source may be a hydrogen gas, etc. The nitrogen source may be a nitrogen gas, etc.

Further, it is preferable that the method for producing the semiconductor structure include: a first n-type silicon carbide single crystal layer forming step of forming a first n-type silicon carbide single crystal layer having the α-type crystal structure, containing nitrogen at an impurity concentration of from $1 \times 10^{17}$ cm$^{-3}$ to $1 \times 10^{19}$ cm$^{-3}$, and having a thickness of 10 μm or less, over the off substrate; a second n-type silicon carbide single crystal layer forming step of forming the second n-type silicon carbide single crystal layer having the α-type crystal structure, containing nitrogen at an impurity concentration of $1 \times 10^{15}$ cm$^{-3}$ or lower, and having a thickness of 50 μm or greater, over the first n-type silicon carbide single crystal layer; and a first p-type silicon carbide single crystal layer forming step of forming a first p-type silicon carbide single crystal layer having the α-type crystal structure, containing aluminum at an impurity concentration of from $1 \times 10^{17}$ cm$^{-3}$ to $1 \times 10^{18}$ cm$^{-3}$, and having a thickness of from 0.5 μm to 5 μm, over the second n-type silicon carbide single crystal layer. In this case, the epitaxial growth step is a step of epitaxially growing a second p-type silicon carbide single crystal layer as the p-type silicon carbide single crystal layer, over the first p-type silicon carbide single crystal layer, which serves as a base layer.

With these steps, it is possible to produce the semiconductor structure according to the third embodiment that is suitable for production of an IGBT semiconductor device (see FIG. 3).

The first n-type silicon carbide single crystal layer and the second n-type silicon carbide single crystal layer may be formed in the first n-type silicon carbide single crystal layer forming step and the second n-type silicon carbide single crystal layer forming step, according to the method for forming the n-type silicon carbide single crystal layer.

The method for forming the first p-type silicon carbide single crystal layer in the first p-type silicon carbide single crystal layer forming step is not particularly limited, and examples include a method of epitaxially growing the first p-type silicon carbide single crystal layer by a publicly-known chemical vapor deposition method. The silicon carbide source during the formation may be, for example, a silane gas, and a propane gas. The carrier gas for the silicon carbide source may be a hydrogen gas, etc. The aluminum source may be trimethyl aluminum, etc.

Further, it is preferable that the method for producing the semiconductor structure include a third n-type silicon carbide single crystal layer forming step of forming a third n-type silicon carbide single crystal layer having an α-type crystal structure, containing nitrogen at an impurity concentration of from $1 \times 10^{15}$ cm$^{-3}$ to $1 \times 10^{17}$ cm$^{-3}$, and having a thickness of 1 μm or less, over the second n0type silicon carbide single crystal layer. In this case, the first p-type silicon carbide single crystal layer forming step is a step of forming a first p-type silicon carbide single crystal layer over the third n-type silicon carbide single crystal layer.

With the third n-type silicon carbide single crystal layer forming step, it is possible to produce the semiconductor structure according to the fourth embodiment that has improved properties at a p/n junction interface of the third n-type silicon carbide single crystal layer (see FIG. 4).

The third n-type silicon carbide single crystal layer may be formed in the third n-type silicon carbide single crystal layer forming step, according to the method for forming the n-type silicon carbide single crystal layer.

Further, it is preferable that the method for producing the semiconductor structure include a removing step of separating the second n-type silicon carbide single crystal layer and the first n-type silicon carbide single crystal layer from each other after the epitaxial growth step, to thereby remove the off substrate and the first n-type silicon carbide single crystal layer.

With the removing step, it is possible to use the semiconductor structure as a semiconductor wafer suitable for production of the IGBT semiconductor device.

The method for removing is not particularly limited, and examples include a mechanical method such as polishing, etc.

It is preferable that the semiconductor structure have a TTV value smaller than the TTV value of the off substrate, where TTV values represent thickness variation. Examples of the method for producing such a semiconductor structure include a method of polishing the growth surface of the second p-type silicon carbide single crystal layer that has been epitaxially grown over a base plane, which is a surface closer than itself to the off substrate, to thereby make the TTV of the whole semiconductor structure equal to or smaller than that of the off substrate, and after this, polishing and removing the off substrate by setting the growth surface as a base plane, to thereby make the TTV of the semiconductor structure from which the off substrate has been removed equal to or smaller than that of the off substrate.

By using a semiconductor structure having such a TTV in a device production process, it is possible to improve the yield during the device production process.

Examples of the method for producing the IGBT semiconductor device using the semiconductor structure include a method of removing the off substrate and the first n-type silicon carbide single crystal layer from the semiconductor structure according to the third embodiment and the fourth embodiment, and then forming a gate electrode over the second n-type silicon carbide single crystal layer via a gate insulation film, to thereby form a MOSFET structure (see FIG. 5 related with the fifth embodiment).

EXAMPLES

Example 1

An n-type 4H silicon carbide single crystal substrate (SiC substrate) inclined from a (0001) Si plane to a [11-20] direction by 8° and having an α-type crystal structure was prepared as an off substrate for crystal growth.

After this SiC substrate was placed in a reaction tube of a horizontal chemical vapor deposition apparatus (CVD apparatus), the pressure in the reaction tube was controlled to $10 \times 10^3$ Pa, while a hydrogen gas was flowed in the reaction tube at a flow rate of 80 slm ($1.3519 \times 10^2$ Pam$^3$/s).

In this state, the SiC substrate was heated to 1,620° C. by means of high-frequency heating by the CVD apparatus, and this state was maintained for 20 minutes. After this, the surface of the SiC substrate was cleaned.

After the surface of the SiC substrate was cleaned, a silane gas was introduced into the reaction tube at 90 sccm ($1.5209 \times 10^{-1}$ Pam$^3$/s), and a propane gas at 30 sccm ($5.07 \times 10^{-2}$ Pam$^3$/s) respectively, such that a C to Si composition ratio in the material gases would be 1:1, while at the same time, trimethyl aluminum as a p-type impurity Al source was introduced into the reaction tube at 40 sccm ($6.76 \times 10^{-2}$ Pam$^3$/s), to perform epitaxial growth over the SiC substrate and to thereby produce a semiconductor structure according to Example 1 in which a p-type silicon carbide single crystal layer was formed over the SiC substrate. The Al impurity concentration in the p-type silicon carbide single crystal layer was $1.5 \times 10^{20}$ cm$^{-3}$.

During the production, epitaxial growth was continued for 4 hours at an epitaxial growth rate of 22 μm/h, to thereby form a p-type silicon carbide single crystal layer having a thickness of 90 μm.

Figure 6:
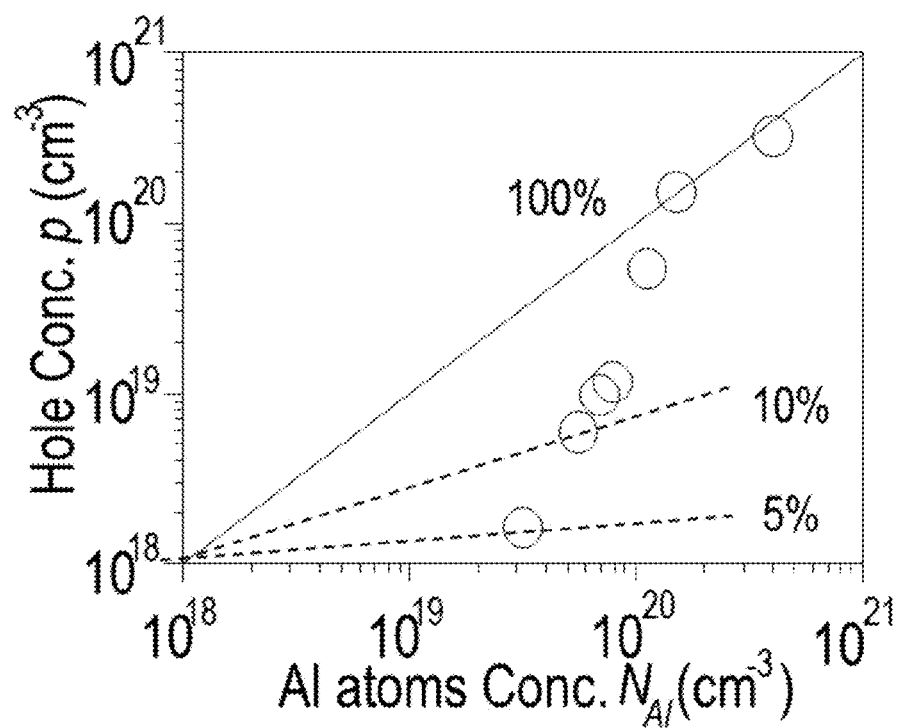
FIG. 6 is a diagram showing an Al impurity activation rate in a p-type silicon carbide single crystal layer.

In Example 1, the Al concentration in the p-type silicon carbide single crystal layer was $1.5 \times 10^{20}$ cm$^{-3}$. However, as shown in FIG. 6, if the Al concentration was $1 \times 10^{19}$ cm$^{-3}$ or higher, Al activation would be observed, and if the Al concentration was $1 \times 10^{20}$ cm$^{-3}$ or higher, the Al activation rate would be 100%, which would make is possible to significantly suppress the resistance of the p-type silicon carbide single crystal layer. FIG. 6 is a diagram showing Al impurity activation rate in the p-type silicon carbide single crystal layer.

Figure 7:
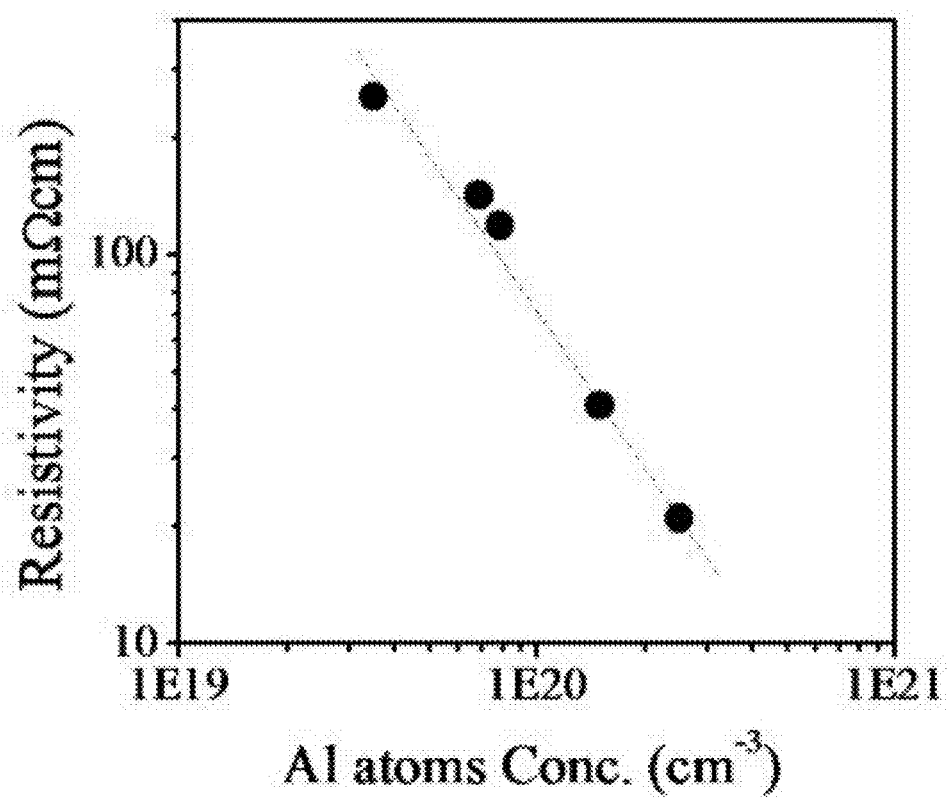
FIG. 7 is a diagram showing a relationship between concentration of Al incorporated into a p-type silicon carbide single crystal layer and resistivity of the p-type silicon carbide single crystal layer.

Resistivity of the semiconductor structure of Example 1 was measured by Van der Pauw method. As a result, a resistivity value of 40 mΩcm was observed, as shown in FIG. 7. FIG. 7 is a diagram showing a relationship between the concentration of Al incorporated into the p-type silicon carbide single crystal layer and the resistivity of the p-type silicon carbide single crystal layer.

That is, in Example 1, a p-type silicon carbide single crystal layer having a resistivity of 40 mΩcm was formed by flowing trimethyl aluminum at 40 sccm ($6.76 \times 10^{-2}$ Pam$^3$/s). By increasing the amount of trimethyl aluminum, it would be possible to increase the Al impurity concentration, and to thereby further suppress the resistivity, as shown in FIG. 7.

Figure 8:
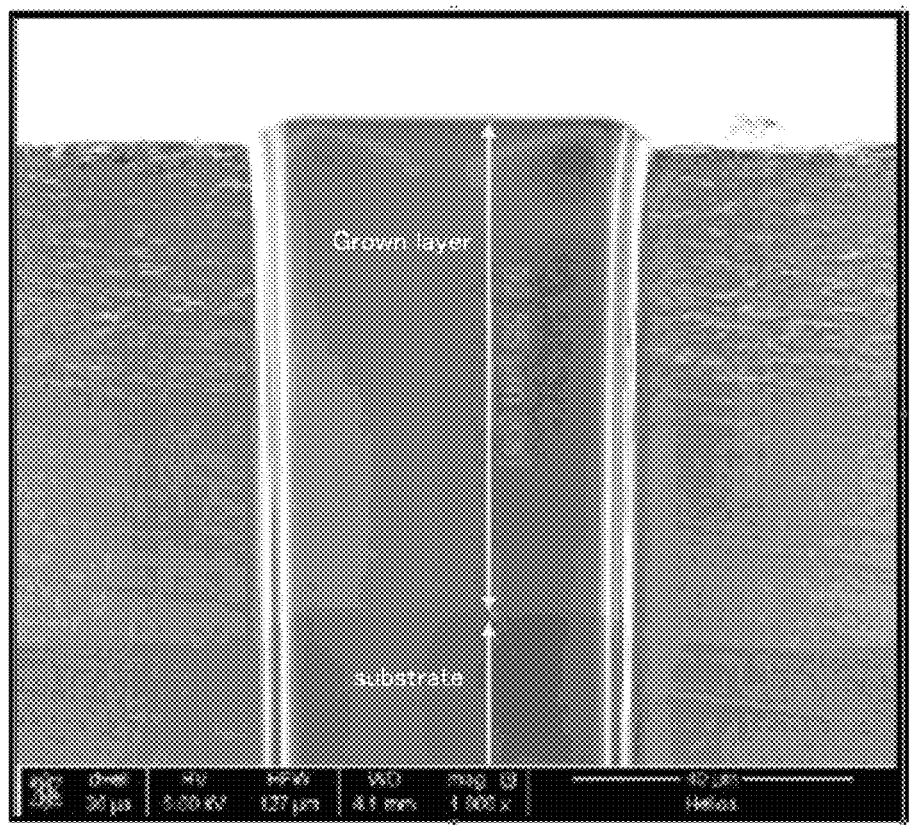
FIG. 8 is a cross-sectional SEM image of a p-type silicon carbide single crystal layer.

FIG. 8 shows a cross-sectional SEM image of the semiconductor structure according to Example 1. The thickness of the semiconductor structure was measured based on this SEM image. Here, the cross-sectional surface of the semiconductor structure was planarized with an ion beam (the central portion in FIG. 8), and the planarized portion was observed with a SEM. As the result of the observation, density variation was observed as a contrast, and the pale portion was the grown layer, whereas the dense portion was the substrate. The thickness of the pale portion measured 90 μm.

In Example 1, a p-type silicon carbide single crystal layer having a thickness of 90 μm was formed as above. However, it is possible to obtain a thickness of 100 μm or greater easily, by increasing the time to be spent on epitaxial growing. Meanwhile, it is also possible to form a p-type silicon carbide single crystal layer having a thickness of 0.5 μm easily, by conversely reducing the time to be spent on epitaxial growing.

Example 2

An n-type 4H silicon carbide single crystal substrate (SiC substrate) inclined from a (0001) Si plane to a [11-20] direction by 8° and having an α-type crystal structure was prepared as an off substrate for crystal growth. This SiC substrate was placed in a reaction tube of a chemical vapor deposition apparatus (CVD apparatus) dedicated to formation of n-type silicon carbide single crystal layers. Using hydrogen as a carrier gas, a silane gas and a propane gas as material gases, and a nitrogen gas as an n-type dopant, a first n-type silicon carbide single crystal layer having a nitrogen impurity concentration of $5 \times 10^{18}$ cm$^{-3}$ was epitaxially grown over the SiC substrate to a thickness of 10 μm.

Next, in the same formation method as the method for forming the first n-type silicon carbide single crystal layer, a second n-type silicon carbide single crystal layer having a nitrogen impurity concentration of $5 \times 10^{14}$ cm$^{-3}$ was epitaxially grown over the first n-type silicon carbide single crystal layer to a thickness of 150 μm.

The semiconductor structure in this state was taken out from the CVD apparatus, and placed in a CVD apparatus that was able to grown both of n-type and p-type.

Temperature conditions in the reaction tube were set to 1,620° C., and pressure conditions were set to $10 \times 10^3$ Pa. Hydrogen as a carrier gas was introduced at a rate of 80 slm ($1.3519 \times 10^2$ Pam$^3$/s), a silane gas and a propane gas as material gases were introduced at 60 sccm ($1.014 \times 10^{-1}$ Pam$^3$/s) and 20 sccm ($3.38 \times 10^{-2}$ Pam$^3$/s) respectively, and a nitrogen gas as an n-type dopant was introduced, to thereby epitaxially grow a third n-type silicon carbide single crystal layer having a nitrogen impurity concentration of $2 \times 10^{16}$ cm$^{-3}$ over the second n-type silicon carbide single crystal layer to a thickness of 1 μm at a growth rate of 15 μm/h.

Next, using trimethyl aluminum as a p-type dopant, a first p-type silicon carbide single crystal layer having an Al impurity concentration of $8 \times 10^{17}$ cm$^{-3}$ was epitaxially grown over the third n-type silicon carbide single crystal layer to a thickness of 2 μm. The epitaxial growing conditions were the same as the growing conditions for the third n-type silicon carbide single crystal layer.

Next, in the same formation method as the method for forming the first p-type silicon carbide single crystal layer, a second p-type silicon carbide single crystal layer having an Al impurity concentration of $1 \times 10^{20}$ cm$^{-3}$ was epitaxially grown over the first p-type silicon carbide single crystal layer to a thickness of 120 μm. However, as the epitaxial growing conditions, a silane gas and a propane gas were introduced at 90 sccm ($1.5209 \times 10^{-1}$ Pam$^3$/s) and 30 sccm ($5.07 \times 10^{-2}$ Pam$^3$/s) respectively, and the growth rate was 22 μm/h.

Figure 9A:
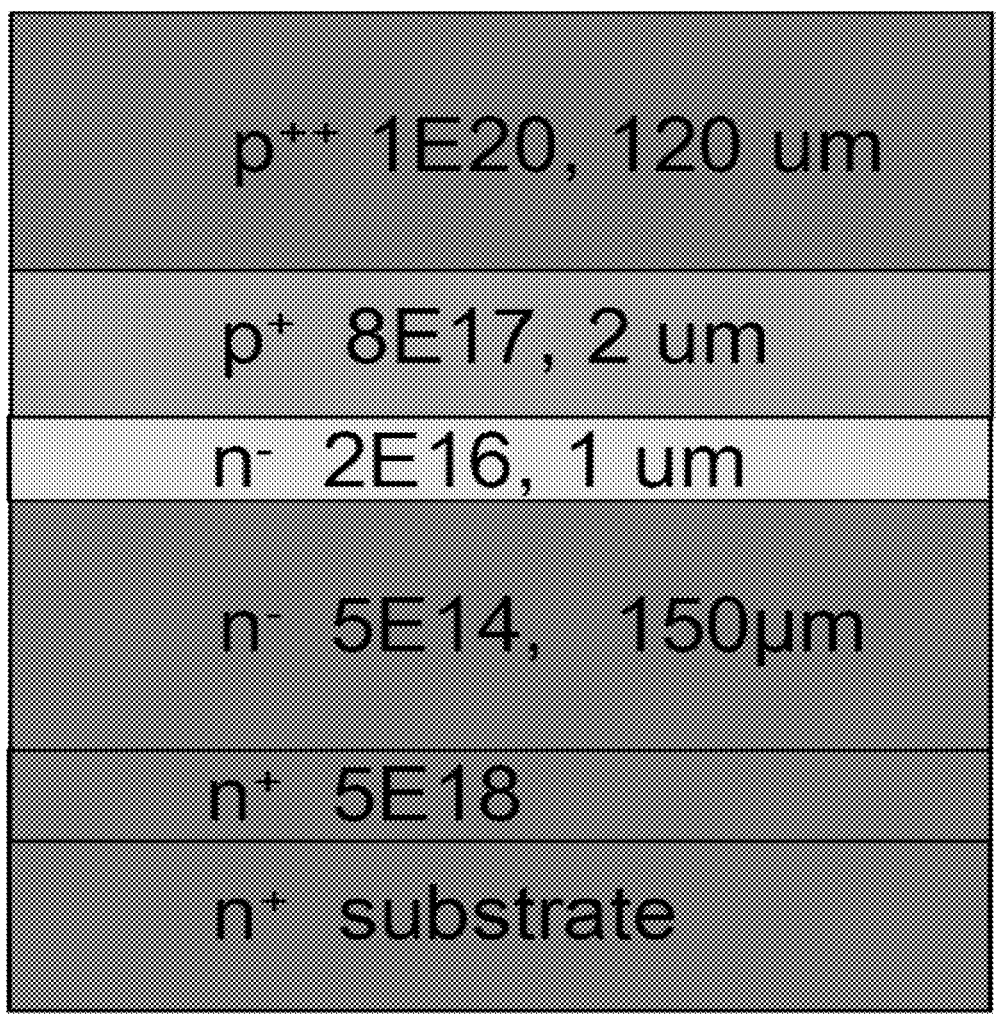
FIG. 9A is a schematic diagram showing a semiconductor structure according to Example 2.
Figure 9B:
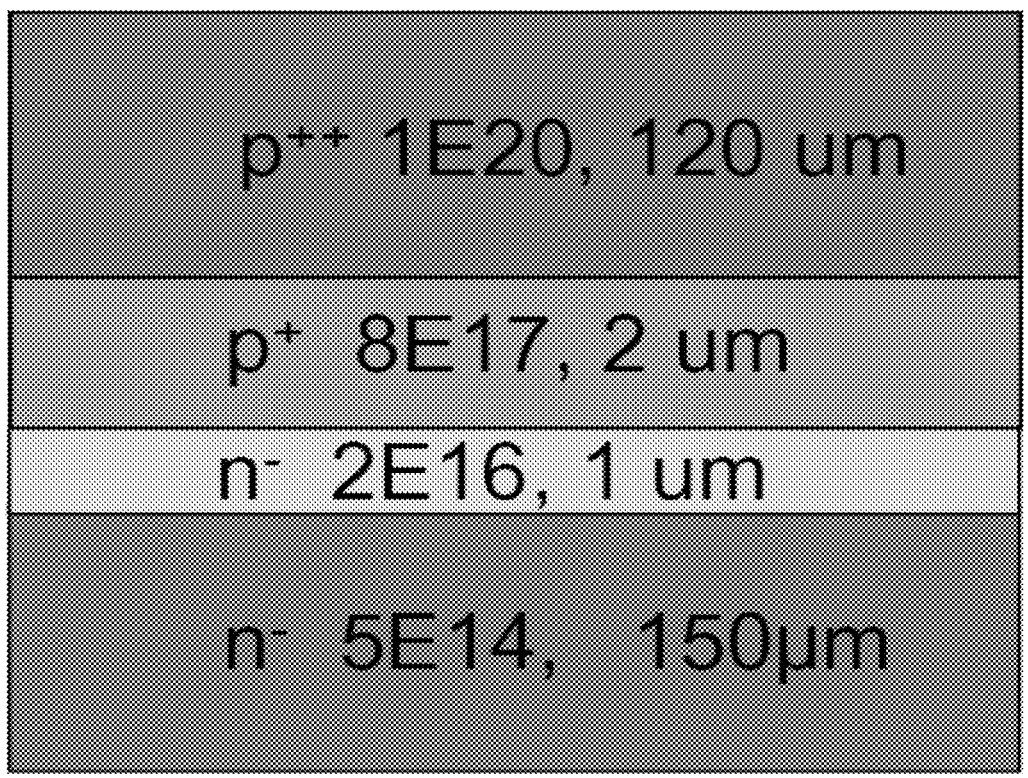
FIG. 9B is a schematic diagram showing how it is like when a substrate is removed from the semiconductor structure shown in FIG. 9A.

As a result, a semiconductor structure of Example 2 including epitaxially grown layers having a total thickness of 283 μm was produced. A schematic diagram showing the configuration of this semiconductor structure of Example 2 is shown in FIG. 9A.

When the first n-type silicon carbide single crystal layer substrate and the SiC substrate are removed from the semiconductor structure of Example 2, a semiconductor structure having a total thickness of 273 μm can be formed. This structure has a [000-1] C plane at a surface of the second n-type silicon carbide single crystal layer at the side from which the first n-type silicon carbide single crystal layer has been removed. By forming a MOS structure over this [000-1] C plane, it is possible to produce a semiconductor device having an IGBT structure.

In the production of the semiconductor structure of Example 2, the CVD apparatus was changed after the second n-type silicon carbide single crystal was formed, for formation of the third n-type silicon carbide single crystal layer and the succeeding layers. However, it is also possible to epitaxially grow all layers with one CVD apparatus continuously.

Furthermore, in the case of continuous growing, there is no need of forming the third n-type silicon carbide single crystal layer over the second n-type silicon carbide single crystal layer, but the first p-type silicon carbide single crystal layer may be epitaxially grown directly over the second n-type silicon carbide single crystal layer.

The impurity concentration in each of the layers constituting the semiconductor structures of Examples 1 and 2 were measured according to a secondary ion mass spectroscopy (SIMS) method.

The thickness of each of the layers constituting the semiconductor structures of Examples 1 and 2 were measured with an electron microscope.

As apparent from the above, with the semiconductor structures of the present invention, it was confirmed that the resistance of a p-type silicon carbide could be suppressed to equal to or less than 1/100 of conventional levels. Further, by growing a p-type layer (second p-type silicon carbide single crystal layer) to a large thickness, it was confirmed possible to produce a semiconductor structure (semiconductor wafer) having an excellent mechanical strength and including a p/n junction structure necessary for constructing an IGBT structure, without using a p-type silicon carbide substrate for imparting a mechanical strength.

Further, in Examples 1 and 2, a 4H-silicon carbide single crystal substrate was used. However, a 6H-silicon carbide single crystal substrate or the like may be used. Furthermore, in Examples 1 and 2, an off substrate inclined to a [11-20] direction by 8° was used. However, the present invention can be carried out without regard to the off angle. Moreover, in Examples 1 and 2, an epitaxial growth layer was formed over a Si plane. However, an epitaxial growth layer may be formed over a C plane.

Example 3

To explore optimum production conditions of the semiconductor structure of the present invention, a production example in which production conditions were changed from the preferable production conditions of Example 1 will be explained below.

That is, a semiconductor structure of Example 3 was produced in the same manner as in Example 1, except that after the surface of a SiC substrate was cleaned, a silane gas, a propane gas, and trimethyl aluminum were introduced into a reaction tube after the substrate temperature was lowered to 1,500° C., and a p-type silicon carbide single crystal layer was formed over the SiC substrate by epitaxial growing, instead of introducing a silane gas, a propane gas, and trimethyl aluminum into a reaction tube at a substrate temperature of 1,620° C. and forming a p-type silicon carbide single crystal layer over the SiC substrate by epitaxial growing.

In the production of the semiconductor structure of Example 3, the epitaxial growth rate became 18 μm/h, which was lower than the epitaxial growth rate (22 μm) in the production of the semiconductor structure of Example 1. In the semiconductor structure of Example 3, the p-type silicon carbide single crystal layer was epitaxially grown at this growth rate to a thickness of 90 μm.

Figure 10:
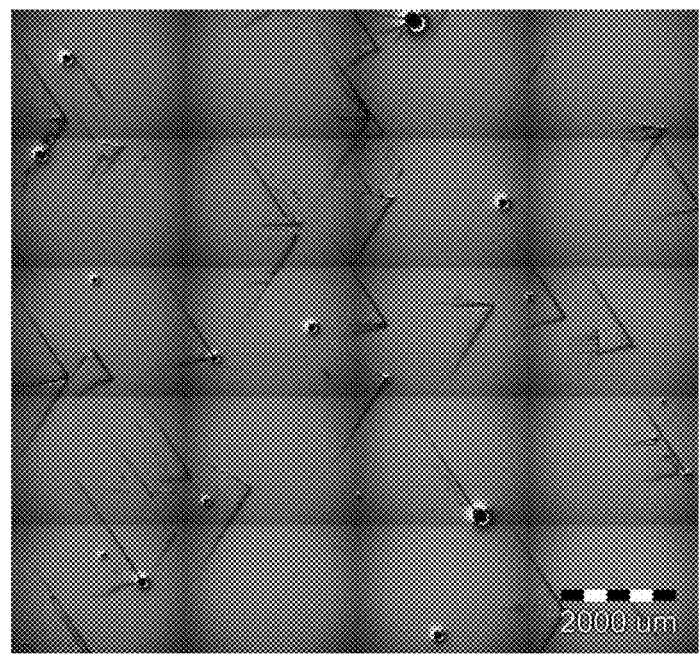
FIG. 10 is a diagram showing a microscopic image capturing a growth surface of a p-type silicon carbide single crystal layer of a semiconductor structure according to Example 3.

In the semiconductor structure of Example 1, the Al concentration in the p-type silicon carbide single crystal layer was $1.5 \times 10^{20}$ cm$^{-3}$. In the semiconductor structure of Example 3, the Al concentration in the p-type silicon carbide single crystal layer was $8.5 \times 10^{20}$ cm$^{-3}$, which was higher than that. However, as shown in FIG. 10, the produced p-type silicon carbide single crystal layer had, all over the wafer, many triangular defects showing that a β-type silicon carbide had been produced, from which it is understood that the p-type silicon carbide single crystal layer was partially polycrystalline. Hence, it is estimated that the crystal would be brittle, and the mechanical strength thereof would be poor. FIG. 10 is a diagram showing a microscopic image capturing the growth surface of the p-type silicon carbide single crystal layer of the semiconductor structure of Example 3.

Example 4

A semiconductor structure of Example 4 was produced in the same manner as in Example 1, except that after the surface of a SiC substrate was cleaned, a p-type silicon carbide single crystal layer was produced over the SiC substrate by epitaxial growing by changing the composition ratio between C and Si in the material gases introduced into the reaction tube from 1:1 to 1.2:1.

Figure 11:
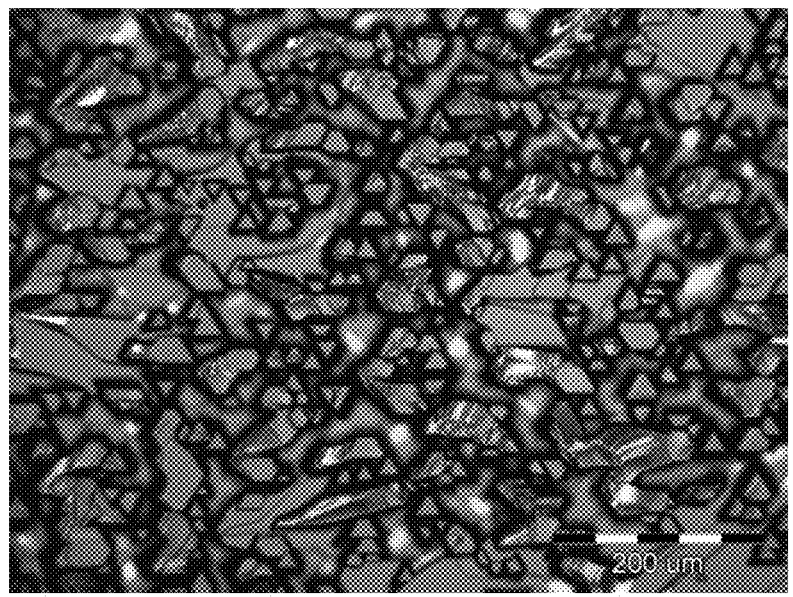
FIG. 11 is a diagram showing a microscopic image capturing a growth surface of a p-type silicon carbide single crystal layer of a semiconductor structure according to Example 4.

The crystal surface of the p-type silicon carbide single crystal layer of the semiconductor structure of Example 4 was undulated as shown in FIG. 11. It turned out that under the production conditions of the present Example in which the C/Si composition ratio was changed, it was impossible to produce a p-type silicon carbide single crystal layer having a high grade. FIG. 11 is a diagram showing a microscopic image capturing the growth surface of the p-type silicon carbide single crystal layer of the semiconductor structure of Example 4.

Example 5

A semiconductor structure of Example 5 was produced in the same manner as in Example 1, except that after the surface of a SiC substrate was cleaned, a p-type silicon carbide single crystal layer was produced over the SiC substrate by epitaxial growing by changing the composition ratio between C and Si in the material gases introduced into the reaction tube from 1:1 to 0.5:1.

In the semiconductor structure of Example 5, the resistivity of the p-type silicon carbide single crystal layer was high and 500 mΩcm. It turned out that under the production conditions of the present Example in which the C/Si composition ratio was changed, the resistivity could not be suppressed sufficiently.

INDUSTRIAL APPLICABILITY

According to the semiconductor structure of the present invention, the resistivity of a p-type silicon carbide single crystal can be suppressed, and an excellent mechanical strength can be obtained at the same time. Therefore, the semiconductor structure of the present invention can be used favorably in the field of producing a semiconductor wafer used for producing a semiconductor device such as an IGBT semiconductor device, etc.

REFERENCE SIGNS LIST 1, 10, 20, 30 semiconductor structure
2, 12 n-type silicon carbide single crystal layer
3, 13 p-type silicon carbide single crystal layer
11, 21, 31 off substrate
22, 32 first n-type silicon carbide single crystal layer
23, 33, 43 second n-type silicon carbide single crystal layer
23, 34, 44 first p-type silicon carbide single crystal layer
25, 35, 45 second p-type silicon carbide single crystal layer
36 third n-type silicon carbide single crystal layer
40 semiconductor device
46 insulation film
47 gate electrode

The invention claimed is:

1. A semiconductor structure, comprising:
a p-type silicon carbide single crystal layer that has an α-type crystal structure, contains aluminum at an impurity concentration of $1\times10^{19}$ cm$^{-3}$ or higher, and has a thickness of 50 µm to 300 µm
wherein the p-type silicon carbide single crystal layer does not contain an impurity except the aluminum; and
wherein the p-type silicon carbide single crystal layer has a resistivity of 100 mΩcm or lower.

2. The semiconductor structure according to claim 1, wherein the impurity concentration of aluminum contained in the p-type silicon carbide single crystal layer is $1\times10^{20}$ cm$^{-3}$ or higher.

3. The semiconductor structure according to claim 2, further comprising:
an n-type silicon carbide single crystal layer that forms a junction with the p-type silicon carbide single crystal layer, has an α-type crystal structure, contains nitrogen at an impurity concentration of $1\times10^{15}$ cm$^{-3}$ or lower, and has a thickness of 50 µm or greater.

4. The semiconductor structure according claim 3, wherein the semiconductor structure has a total thickness of 250 µm or greater.

5. A semiconductor structure, comprising:
a p-type silicon carbide single crystal layer that is formed directly or indirectly over an off substrate inclined from a (0001) plane by 8° or less but greater than 0° and made of a silicon carbide single crystal having an α-type crystal structure, has the α-type crystal structure, and contains aluminum at an impurity concentration of $1\times10^{19}$ cm$^{-3}$ or higher; and
an n-type silicon carbide single crystal layer that has the α-type crystal structure, contains nitrogen at an impurity concentration of $1\times10^{15}$ cm$^{-3}$ or lower, has a thickness of 50 µm or greater, and is disposed to form a junction with the p-type silicon carbide single crystal layer, wherein the p-type silicon carbide single crystal layer does not contain an impurity except the aluminum; and wherein the p-type silicon carbide single crystal layer has a resistivity of 100 mΩcm or lower.

6. The semiconductor structure according to claim 5, wherein the p-type silicon carbide single crystal layer has a thickness of 0.5 µm or greater.

7. The semiconductor structure according to claim 5, wherein the semiconductor structure has a total thickness of 250 µm or greater.

8. The semiconductor structure according to claim 7, further comprising:
a first n-type silicon carbide single crystal layer that has an α-type crystal structure, contains nitrogen at an impurity concentration of from $1\times10^{17}$ cm$^{-3}$ to $1\times10^{19}$ cm$^{-3}$, and has a thickness of 10 µm or less; and
a first p-type silicon carbide single crystal layer that has the α-type crystal structure, contains aluminum at an impurity concentration of from $1\times10^{17}$ cm$^{-3}$ to $1\times10^{18}$ cm$^{-3}$, and has a thickness of from 0.5 µm to 5 µm,
wherein the first n-type silicon carbide single crystal layer, the n-type silicon carbide single crystal layer as a second n-type silicon carbide single crystal layer, the first p-type silicon carbide single crystal layer, and the p-type silicon carbide single crystal layer as a second p-type silicon carbide single crystal layer are formed in this order over the off substrate inclined from the (0001) plane by 8° or less but greater than 0° and made of the silicon carbide single crystal having the α-type crystal structure.

9. The semiconductor structure according to claim 8, further comprising:
a third n-type silicon carbide single crystal layer that has an α-type crystal structure, contains nitrogen at an impurity concentration of from $1\times10^{15}$ cm$^{-3}$ to $1\times10^{17}$ cm$^{-3}$, and has a thickness of 1 µm or less,
wherein the third n-type silicon carbide single crystal layer is disposed between the second n-type silicon carbide single crystal layer and the first p-type silicon carbide single crystal layer.

10. The semiconductor structure according to claim 9, wherein the semiconductor structure has a TTV value equal to or less than a TTV value of the off substrate, where the TTV values represent thickness variation.

11. The semiconductor structure according to claim 10, further comprising:
a MOS structure formed over a [000-1]C plane of the semiconductor structure, resulting in a semiconductor device which is an IGBT semiconductor device.

* * * * *